US009773771B2

(12) United States Patent
Wu et al.

(10) Patent No.: US 9,773,771 B2
(45) Date of Patent: Sep. 26, 2017

(54) DISPLAY PANEL

(71) Applicant: Chunghwa Picture Tubes, LTD., Taoyuan (TW)

(72) Inventors: Shen-Yu Wu, Taoyuan (TW); Yun-Chih Chen, Taoyuan (TW); Hung-Hsiang Chen, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 78 days.

(21) Appl. No.: 14/939,791

(22) Filed: Nov. 12, 2015

(65) Prior Publication Data

US 2017/0103975 A1    Apr. 13, 2017

(30) Foreign Application Priority Data

Oct. 13, 2015   (CN) .......................... 2015 1 0670276

(51) Int. Cl.
*H01L 27/12* (2006.01)
*G09G 3/3275* (2016.01)
*H01L 27/02* (2006.01)

(52) U.S. Cl.
CPC ........ *H01L 27/0207* (2013.01); *H01L 27/124* (2013.01); *H01L 27/1218* (2013.01)

(58) Field of Classification Search
CPC ............... H01L 27/0207; H01L 27/124; H01L 27/1218; G09G 3/3275
See application file for complete search history.

(56) References Cited

U.S. PATENT DOCUMENTS

| 6,456,353 | B1 * | 9/2002 | Chen | G02F 1/13452 |
| | | | | 349/149 |
| 6,903,717 | B2 | 6/2005 | Takahashi et al. | |
| 2006/0267889 | A1 * | 11/2006 | Kimura | G09G 3/2022 |
| | | | | 345/84 |
| 2007/0138654 | A1 * | 6/2007 | Kim | H01L 23/49838 |
| | | | | 257/786 |
| 2010/0053057 | A1 * | 3/2010 | Chung | G09G 3/3685 |
| | | | | 345/98 |
| 2014/0063023 | A1 * | 3/2014 | Baek | G09G 1/00 |
| | | | | 345/501 |

FOREIGN PATENT DOCUMENTS

TW    I264689    10/2006

* cited by examiner

*Primary Examiner* — Ibrahim Khan
(74) *Attorney, Agent, or Firm* — J.C. Patents

(57) ABSTRACT

A display panel including a substrate, a first and second driving chips, a circuit board and multiple second signal traces are provided. The first and second driving chips are disposed in a non-display region and located adjacent to each other. The first driving chip has multiple first pins disposed on a first short side and a first long side of the first driving chip. The second driving chip has multiple second pins disposed on a second short side and a second long side of the second driving chip. In the non-display region, a width of the circuit board is smaller than a total width of the first driving chip, the second driving chip and a distance between the first driving chip and the second driving chip, and the circuit board has a plurality of first signal traces. The display panel of the invention decreases an amount of required circuit boards.

8 Claims, 4 Drawing Sheets

DISPLAY PANEL

CROSS-REFERENCE TO RELATED APPLICATION

This application claims the priority benefit of China application serial no. 201510670276.5, filed on Oct. 13, 2015. The entirety of the above-mentioned patent application is hereby incorporated by reference herein and made a part of this specification.

BACKGROUND OF THE INVENTION

Field of the Invention

The invention relates to a panel, and particularly relates to a display panel.

Description of Related Art

Components of a display include a display panel, a light source for providing enough brightness to the display panel and a driving chip disposed on a substrate of the display panel, where the driving chip is used for driving a circuit in internal of the display panel to drive the display panel to display an image.

In recent years, since functions of the driving chip of the display are quickly developed, the amount of input signal pins of the driving chip is generally hundreds or even thousands, and disposition of the input signal pins becomes a big problem. Under a condition that the amount of the input signal pins is not changed or getting more, if a panel resolution is continuously increased, more driving chips have to be used, which increases a total cost of the display. Therefore, it is an important problem to be resolved to provide necessary or more input signals within a limited space, so as to decrease a usage amount of flexible circuit boards or an occupation area thereof to avail a slim border design of the display panel.

SUMMARY OF THE INVENTION

The invention is directed to a display panel, which has a decreased amount of required circuit boards.

The invention is directed to another display panel, which has a slim boarder design.

The invention provides a display panel including a substrate, a first driving chip, a second driving chip, a circuit board and a plurality of second signal traces. The substrate has a display region and a non-display region located at a side of the display region. The first driving chip is disposed in the non-display region and has a plurality of first pins, and the first pins are disposed on a first short side and a first long side of the first driving chip, where the first short side and the first long side are adjacent to each other. The second driving chip is disposed in the non-display region and is disposed adjacent to the first driving chip, and has a plurality of second pins, and the second pins are disposed on a second short side and a second long side of the second driving chip, where the second short side is adjacent to the second long side, the first short side is adjacent to the second short side, and the first long side is adjacent to the second long side. The circuit board is bonded to the non-display region, and a width of the circuit board in the non-display region is smaller than a total width of the first driving chip, the second driving chip and a distance between the first driving chip and the second driving chip in the non-display region, and has a plurality of first signal traces. A part of the second signal traces are respectively connected to the first pins of the first driving chip and a part of the first signal traces. A part of the second signal traces are respectively connected to the second pins of the second driving chip and a part of the first signal traces.

In an embodiment of the invention, the second signal traces connected to the first pins on the first short side are adjacent to the second signal traces connected to the second pins on the second short side.

In an embodiment of the invention, a part of the first pins are located on the first long side at a part close to the second driving chip, and a part of the second pins are located on the second long side at a part close to the first driving chip.

In an embodiment of the invention, the width of the circuit board in the non-display region is smaller than or equal to a half of the total width of the first driving chip, the second driving chip and the distance between the first driving chip and the second driving chip in the non-display region.

In an embodiment of the invention, an amount of all of the circuit boards is smaller than or equal to a half of an amount of all of the first and second driving chips.

In an embodiment of the invention, the first driving chip and the second driving chip are adjacent to a long side of the display region.

The invention provides a display panel including a substrate, a driving chip, a circuit board and second signal traces. The substrate has a display region and a non-display region located at a side of the display region. The driving chip is disposed in the non-display region, and has a plurality of pins only disposed on a short side of the driving chip. The circuit board is bonded to the non-display region and is located beside the short side of the driving chip, and has a plurality of first signal traces. The second signal traces are respectively connected to the pins of the driving chip and the first signal traces.

In an embodiment of the invention, the driving chip is adjacent to a short side of the display region.

In an embodiment of the invention, a width of the non-display region is about 2.5 mm.

According to the above descriptions, in the display panel of the invention, by changing a position of external traces of the driving chips, the usage amount of the circuit boards is decreased or the circuit board may be disposed beside the short side of the driving chip. In this way, the usage amount of the circuit boards and an occupation area thereof are greatly decreased, so as to decrease a manufacturing cost of the display panel to avail a slim boarder development of the display panel.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
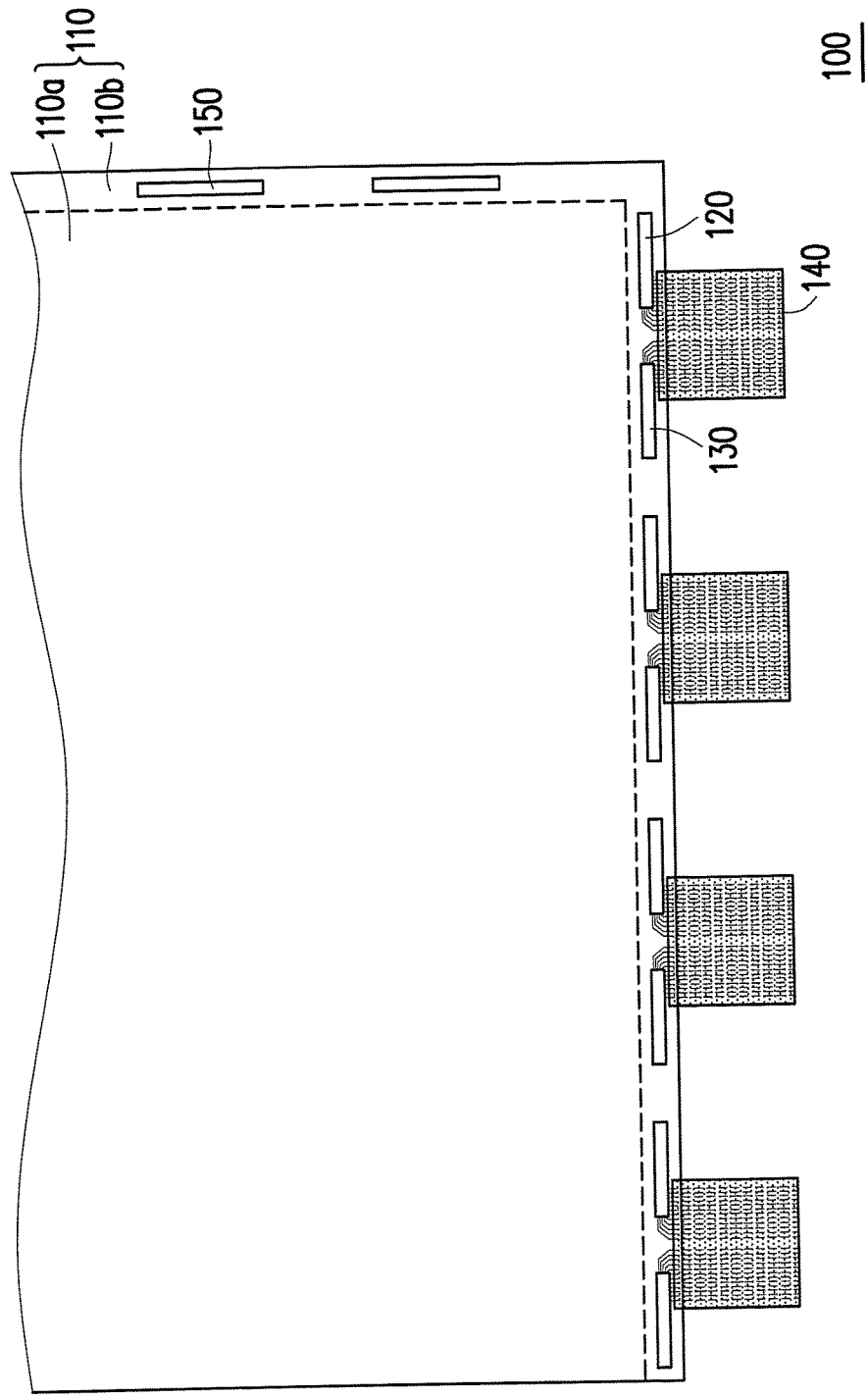
FIG. 1A is a schematic diagram of a display panel according to an embodiment of the invention.
Figure 1B:
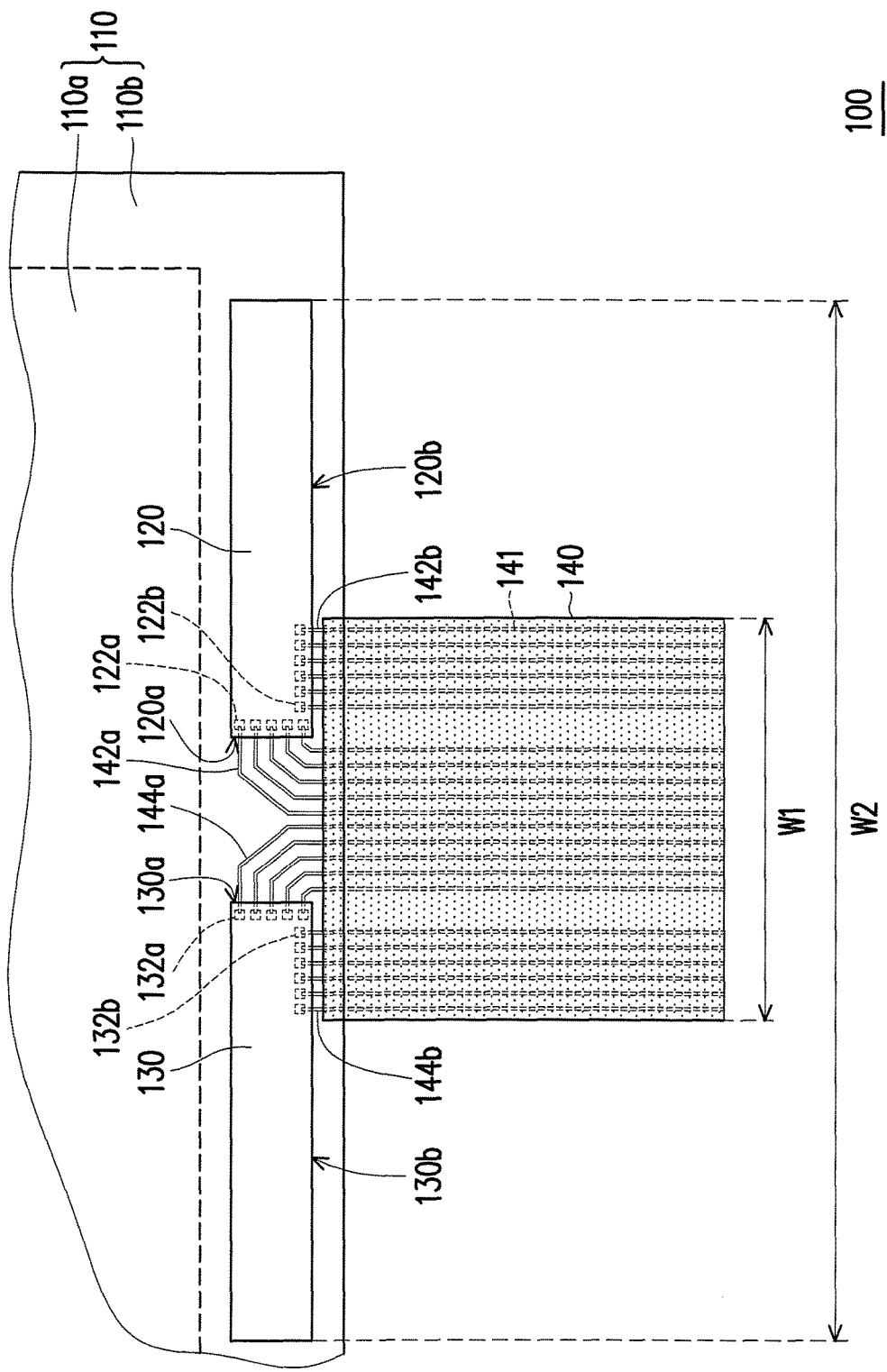
FIG. 1B is a partial enlarged view of FIG. 1A.

FIG. 1A is a schematic diagram of a display panel according to an embodiment of the invention, and FIG. 1B is a partial enlarged view of FIG. 1A. Referring to FIG. 1A and FIG. 1B, the display panel 100 includes a substrate 110, a first driving chip 120, a second driving chip 130, a circuit board 140 and a plurality of second signal traces 142a, 142b, 144a, 144b. The substrate 110 has a display region 110a and a non-display region 110b located at a side of the display region 110a. In the present embodiment, the display panel 100 is, for example, a large-scale landscape panel. The non-display region 110b is, for example, located adjacent to a long side of the display region 110a, though the invention is not limited thereto.

Referring to FIG. 1A and FIG. 1B, the first driving chip 120 is disposed in the non-display region 110b, and has a plurality of first pins 122a, 122b, and the first pins 122a, 122b are disposed on a first short side 120a and a first long side 120b of the first driving chip 120, where the first short side 120a and the first long side 120b are adjacent to each other. In the present embodiment, the first pins 122a are, for example, evenly distributed on the first short side 120a, and the first pins 122b are, for example, only disposed on a part of the first long side 120b close to the first short side 120a, i.e. a part of the first long side 120b close to the second driving chip 130. Therefore, the first pins 122a, 122b are, for example, intensively disposed in the region close to the second driving chip 130. In the present embodiment, the first driving chip 120 is, for example, an independent source driving chip or an integrated source driving chip, which is not limited by the invention.

The second driving chip 130 is disposed in the non-display region 110b and is disposed adjacent to the first driving chip 120, and has a plurality of second pins 132a, 132b, and the second pins 132a, 132b are disposed on a second short side 130a and a second long side 130b of the second driving chip 130, where the second short side 130a and the second long side 130b are adjacent to each other, and the first short side 120a is adjacent to the second short side 130a, and the first long side 120b is adjacent to the second long side 130b. In the present embodiment, the second pins 132a are, for example, evenly distributed on the second short side 130a, and the second pins 132b are, for example, only disposed on a part of the second long side 130b close to the second short side 130a, i.e. a part of the second long side 130b close to the first driving chip 120. Therefore, the second pins 132a, 132b are, for example, intensively disposed in the region close to the first driving chip 120. In the present embodiment, the second driving chip 130 is, for example, an independent source driving chip or an integrated source driving chip, which is not limited by the invention.

In the present embodiment, the display panel 100, for example, further includes other driving chips 150, where the driving chips 150 are located at a side of the display region 110a different from the sides of the display region 110a where the first and the second driving chips 120 and 130 are disposed. For example, in the present embodiment, the first driving chip 120 and the second driving chip 130 are, for example, located adjacent to the long side of the display region 110a, and the driving chips 150 are, for example, located adjacent to the short side of the display region 110a, though the invention is not limited thereto.

The circuit board 140 is bonded to the non-display region 110b, and a width W1 of the circuit board 140 in the non-display region 110b is smaller than a total width W2 of the first driving chip 120, the second driving chip 130 and a distance between the first driving chip 120 and the second driving chip 130 in the non-display region 110b. The circuit board 140 has a plurality of first signal traces 141. The first signal traces 141 are, for example, distributed over the circuit board 140.

The second signal traces 142a, 142b are connected to the first pins 122a, 122b of the first driving chips 120 and the first signal traces 141, and the second signal traces 144a, 144b are connected to the second pins 132a, 132b of the second driving chips 130 and the first signal traces 141. In the present embodiment, the second signal traces 142a connected to the first pins 122a located at the first short side 120a are disposed adjacent to the second signal traces 144a connected to the second pins 132a located at the second short side 130a. Namely, the second signal traces 142a, 144a are, for example, located between the first driving chip 120 and the second driving chip 130, and the second signal traces 142a are extended from the first short side 120a and make a turn to electrically connect the first signal traces 141 on the circuit board 140, and the second signal traces 144a are extended from the first short side 130a and make a turn to electrically connect the first signal traces 141 on the circuit board 140. In the present embodiment, the second signal traces 142a, 142b, 144a, 144b are, for example, intensively distributed in a region between the first driving chip 120 and the second driving chip 130 and two sides of the region.

In the present embodiment, the width W1 of the circuit board 140 in the non-display region 110b is, for example, smaller than a half of the total width W2 of the first driving chip 120, the second driving chip 130 and the distance between the first driving chip 120 and the second driving chip 130 in the non-display region 110b. The circuit board 140 is, for example, a flexible printed circuit board. In the present embodiment, the second signal traces 142a, 142b, 144a, 144b of the first and the second driving chips 120, 130 located adjacent to each other in pairs are electrically connected to the first signal traces 141 on a same piece of the circuit board 140. Therefore, in the display panel 100, the amount of all of the circuit boards 140 located adjacent to one side of the display region 110a is, for example, smaller than or equal to the amount of all of the first and second driving chips 120, 130. For example, the number of all of the circuit boards 140 located adjacent to the long side of the display region 110a is smaller than or equal to a half of the amount of all of the first and second driving chips 120, 130. In case that 8 driving chips 120, 130 are adopted, the amount of the circuit boards 140 connected to the driving chips 120, 130 can be decreased from the original 8 to 4.

Compared to the conventional driving chip with the pins disposed to the same side (which is generally the long side), in the present embodiment, a part of the pins 122a, 132a of the driving chips 120, 130 are disposed on the short sides 120a, 130a, and a part of the pins 122b, 132b are disposed on the long sides 120b, 130b. In the present embodiment, the pins 122a, 132a on the short sides 120a, 130a are, for example, necessary pins, which are, for example, a time controller (TCON) pin, a source pin, a gate pin, a power pin, a ground (GND) pin, etc., though the invention is not limited thereto. In detail, the short sides 120a, 130a of the driving chips 120, 130 are, for example, smaller than 1000 μm, and considering a process limit, a width of a metal pad and a distance between the metal pads for input signals have to be more than 12 μm, and deduced according to such limit, about 40 pins can be disposed on the short sides 120a, 130a, which are enough for the aforementioned necessary pins. Moreover, in order to decrease the amount of the total pins of the driving chips 120, 130, a disposing sequence and content of the pins can be adjusted according to an actual design and package of the driving chip. For example, a control pin such as a Gamma pin, etc., may adopt an inbuilt setting value, and an external instruction can be used to implement control thereof without pulling out the pin. Moreover, a dummy pin and a test point pin can be removed. Namely, by decreasing repeated or test pins (for example, a test pin preserved for debug), the amount of the actually used necessary pins can be a half of the amount of the original pins or even less, and the positions of the necessary pins are adjusted to be at the short sides 120a, 130a and a part of the long sides 120b, 130b of the driving chips 120, 130, such that the second signal traces 142a, 142b, 144a, 144b of the first and the second driving chips 120, 130 located adjacent to each other in pairs are electrically connected to the first signal traces 141 on a same piece of the circuit board 140.

In the present embodiment, by disposing the pins on the short sides and a part of the long sides of the driving chips, the signal traces of the driving chips located adjacent to each other in pairs can be electrically connected to the same circuit board. In this way, the amount or widths of the circuit boards can be decreased, so as to decrease a manufacturing cost of the display panel, which is complied with the concept of environmental protection, and meanwhile product reliability similar to that of the conventional display panel is achieved. Moreover, in view of a manufacturing process, since the amount of the attached circuit board is decreased, an attaching error ratio is effectively decreased, and a yield of the display panels is greatly improved.

Figure 2A:
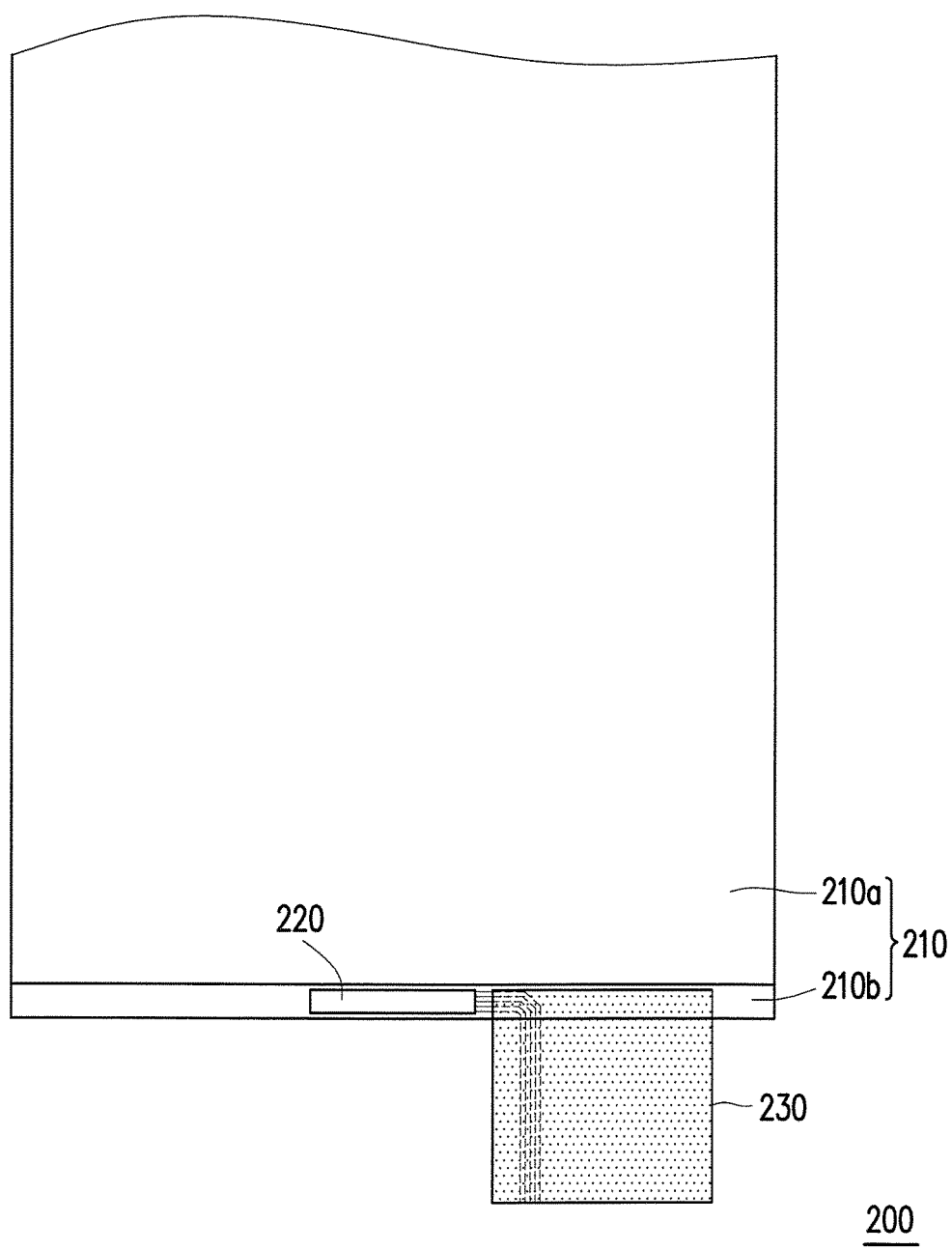
FIG. 2A is a schematic diagram of a display panel according to an embodiment of the invention.
Figure 2B:
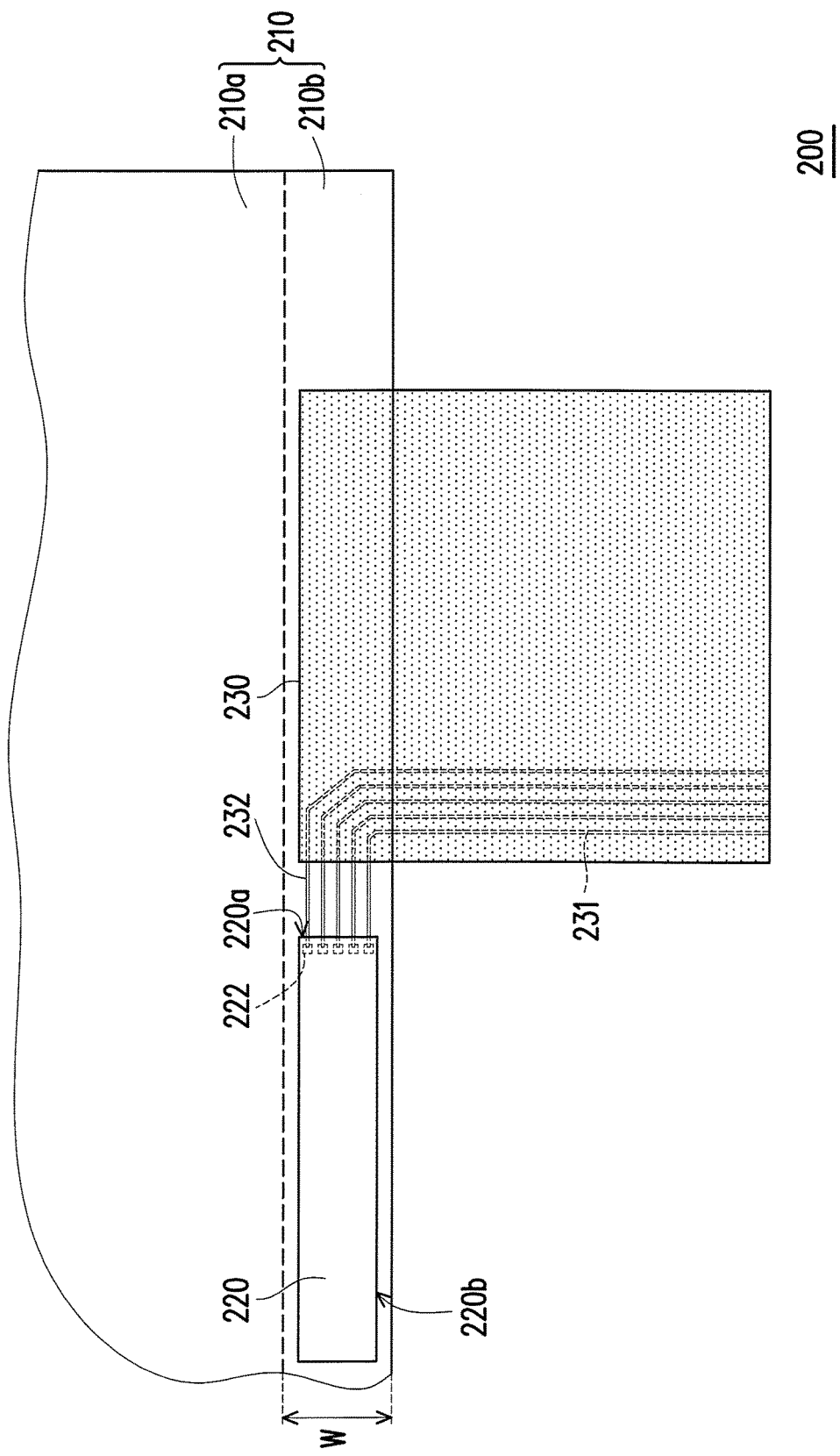
FIG. 2B is a partial enlarged view of FIG. 2A.

FIG. 2A is a schematic diagram of a display panel according to an embodiment of the invention, and FIG. 2B is a partial enlarged view of FIG. 2A. Referring to FIG. 2A and FIG. 2B, the display panel 200 includes a substrate 210, a driving chip 220, a circuit board 230 and a plurality of second signal traces 232. The substrate 210 has a display region 210a and a non-display region 210b located at a side of the display region 210a. In the present embodiment, the display panel 200 is, for example, a small size portrait panel such as a display panel of a smart phone. The non-display region 210b is, for example, located adjacent to a long side of the display region 210a, though the invention is not limited thereto.

Referring to FIG. 2A and FIG. 2B, the driving chip 220 is disposed in the non-display region 210b, and has a plurality of pins 222 only disposed on a short side 220a of the driving chip 220. Namely, the pins 222 are all disposed on the short side 220a of the driving chip 220, and there is no pins 222 disposed on a long side 220b of the driving chip 220. In the present embodiment, the pins 222 on the short side 220a are, for example, necessary pins, which are, for example, a TCON pin, a source pin, a gate pin, a power pin, a GND pin, etc., though the invention is not limited thereto.

When the driving chip 220 is an integrated driving chip, it is avoided to use a handshake pin.

The circuit board 230 is bonded to the non-display region 210b and is located beside the short side 220a of the driving chip 220, and has a plurality of first signal traces 231. The second signal traces 232 are respectively connected to the pins 222 of the driving chip 230 and the first signal traces 231. Namely, the second signal traces 232 are, for example, intensively distributed in a region beside the driving chip 220.

Generally, regarding the small size portrait panel of a smart phone, in order to achieve a better user experience, development of various slim border designs on a long side part of the panel are implemented. For example, most of today's small size panels adopt a circuit design of gate in panel (GIP) to achieve the slim border effect. However, regarding the part of an image signal source, the driving chips and the flexible printed circuit boards have to be attached to the short side of the panel (i.e. beside the long side of the driving chip), which results in a fact that a certain width, for example, 3.8 mm is still required at a boarder portion of the short side of the panel (i.e. the non-display region). In the present embodiment, by disposing all of the necessary pins 222 on the short side 220a of the driving chip 220, the circuit board 230 can be disposed beside the short side 220a of the driving chip 220 without disposing the same beside the long side 220b of the driving chip 220. Therefore, by attaching the circuit board 230 beside the short side 220a of the driving chip 220, it is avoided to increase a width of the non-display region 210b, and the width W of the non-display region 210b is decreased to about 2.5 mm, so as to achieve the slim border effect.

In summary, in the display panel of the invention, by gathering the pins of the driving chip on the short side and a part of the long side of the driving chip located adjacent to another driving chip, the external traces are gathered in a region between the two adjacent driving chips. In this way, the two adjacent driving chips may use a same circuit board, so as to greatly decrease the usage amount of the circuit boards. In the display panel of another embodiment of the invention, the pins of the driving chips are gathered at the short side of the driving chip, such that the circuit board can be disposed beside the short side of the driving chip, so as to avoid a situation that the circuit board occupies the non-display region beside the long side of the driving chip. Therefore, the invention may greatly decrease the usage amount of the circuit boards and the occupied area thereof, so as to decrease the manufacturing cost of the display panel to avail a slim boarder development of the display panel.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A display panel, comprising:
 a substrate, having a display region and a non-display region located at a side of the display region;
 a first driving chip, disposed in the non-display region, and having a plurality of first pins, and the first pins being disposed on a first short side and a first long side of the first driving chip, wherein the first short side and the first long side are adjacent to each other;
 a second driving chip, disposed in the non-display region and disposed adjacent to the first driving chip, and having a plurality of second pins, and the second pins being disposed on a second short side and a second long side of the second driving chip, wherein the second short side is adjacent to the second long side, the first short side is adjacent to the second short side, and the first long side is adjacent to the second long side, wherein a part of the first pins are located on the first long side at a part close to the second driving chip, and a part of the second pins are located on the second long side at a part close to the first driving chip;
 a circuit board, bonded to the non-display region, wherein a width of the circuit board in the non-display region is smaller than a total width of the first driving chip, the second driving chip and a distance between the first driving chip and the second driving chip in the non-display region, and the circuit board has a plurality of first signal traces; and a plurality of second signal traces, wherein a part of the second signal traces are respectively connected to the first pins of the first driving chip and a part of the first signal traces, and a part of the second signal traces are respectively connected to the second pins of the second driving chip and a part of the first signal traces.

2. The display panel as claimed in claim 1, wherein the second signal traces connected to the first pins on the first short side are adjacent to the second signal traces connected to the second pins on the second short side.

3. The display panel as claimed in claim 1, wherein the width of the circuit board in the non-display region is smaller than or equal to a half of the total width of the first driving chip, the second driving chip and the distance between the first driving chip and the second driving chip in the non-display region.

4. The display panel as claimed in claim 1, wherein an amount of all of the circuit boards is smaller than or equal to a half of an amount of all of the first and second driving chips.

5. The display panel as claimed in claim 1, wherein the first driving chip and the second driving chip are adjacent to a long side of the display region.

6. A display panel, comprising:

a substrate, having a display region and a non-display region located at a side of the display region;

a driving chip, disposed in the non-display region, and having a plurality of pins only disposed on a short side of the driving chip;

a circuit board, bonded to the non-display region and located beside the short side of the driving chip, and having a plurality of first signal traces, wherein a side of the circuit board is facing to the short side of the driving chip; and a plurality of second signal traces, respectively connected to the pins of the driving chip and the first signal traces.

7. The display panel as claimed in claim 6, wherein the driving chip is adjacent to a short side of the display region.

8. The display panel as claimed in claim 6, wherein a width of the non-display region is about 2.5 mm.

* * * * *